Sept. 24, 1968 M. J. BRIENZA 3,403,052

METHOD FOR BONDING CONTACTS TO SEMICONDUCTOR OSCILLATOR CRYSTALS

Filed Sept. 3, 1965

INVENTOR
MICHAEL J. BRIENZA
BY
Donald J. Bradley
ATTORNEY

United States Patent Office 3,403,052

Patented Sept. 24, 1968

3,403,052

METHOD FOR BONDING CONTACTS TO SEMICONDUCTOR OSCILLATOR CRYSTALS

Michael J. Brienza, Vernon, Conn., assignor to United Aircraft Corporation, East Hartford, Conn., a corporation of Delaware Filed Sept. 3, 1965, Ser. No. 485,028
6 Claims. (Cl. 117—212)

ABSTRACT OF THE DISCLOSURE

A method of bonding tin contacts on to a gallium arsenide semiconductor crystal which comprises simultaneous deposition of tin through holes in masks which cover opposite sides of said crystal.

This invention relates to an improved oscillator, and particularly to a method for bonding leads to a solid state microwave oscillator whose power output and efficiency is higher than that obtained from comparable microwave oscillators such as reflex klystrons.

Specifically, certain semiconductor crystal compounds of the GaAs and CdTe type, when subjected to a uniform electric field above a critical value, exhibit a current instability which is periodic and of an extremely high frequency. This phenomenon was first reported by J. B. Gunn in the IBM Journal of Research and Development 8, 141 (1964), and is sometimes referred to as the Gunn effect. It has been found that by preparing the contacts to the semiconductor crystal in a manner different from that reported by Gunn, and by operating the crystal at temperatures between 195° K. and 300° K., current oscillations of large amplitude are produced, with a corresponding increase in efficiency. Although the novel results produced by practicing this invention are believed to be a modification or extension of the Gunn effect, the possibility that the large amplitude oscillations are produced by a phenomenon other than the Gunn effect is not discounted.

The Gunn effect in GaAs, for example, is characterized by the fact that in short crystal specimens when an electric field of a few thousand volts per centimeter is applied, coherent oscillations in current occur when the electric field exceeds a well-defined threshold. The current oscillations are characterized by the fact that the current rarely exceeds the threshold current $I_T$, which is that current through the crystal corresponding to the voltage applied across the crystal at the onset of oscillation. Beyond threshold, the time average current is less than $I_T$.

By practicing the invention disclosed herein, current oscillations of a nature different from those reported by Gunn may be generated. These oscillations are of large amplitude and generally have their peaks almost symmetrically disposed about $I_T$. The frequency of the large amplitude oscillations is substantially greater than that of an equivalent Gunn oscillator.

In other aspects the oscillations are similar to the normal Gunn effect. They can be quenched completely by increasing the applied voltage to well above threshold, and coherent oscillations may be obtained by proper adjustment of the circuit parameters.

The higher efficiency of the oscillator described herein makes the device very attractive as a replacement for existing low-power microwave oscillators. Those skilled in the art will readily conceive of numerous applications of the invention, particularly wherever microwave oscillators may be used.

It is therefore an object of this invention to provide a method for producing a novel solid state microwave oscillator having a higher efficiency than prior art devices.

Another object of this invention is a novel method for bonding leads to a crystal to thereby produce an improved microwave oscillator.

These and other objects of this invention will be better understood by referring to the following description and claims, read in conjunction with the accompanying drawings, in which:

Figure 1:
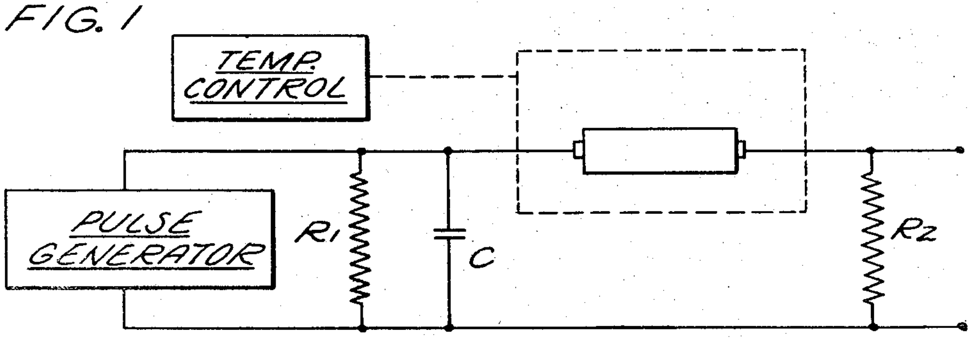
FIGURE 1 is a schematic of the oscillator circuit of this invention.
Figure 2:
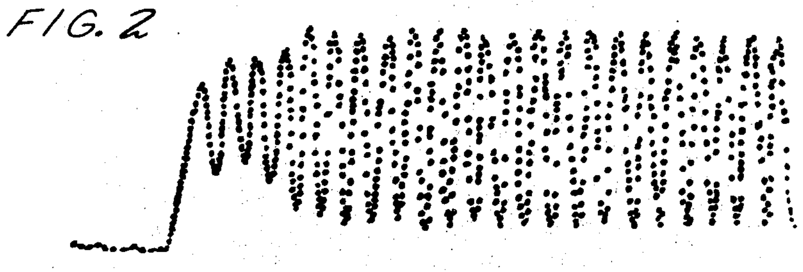
FIGURE 2 shows the current oscillations of the novel oscillator of this invention as a function of applied voltage and time.
Figure 3:
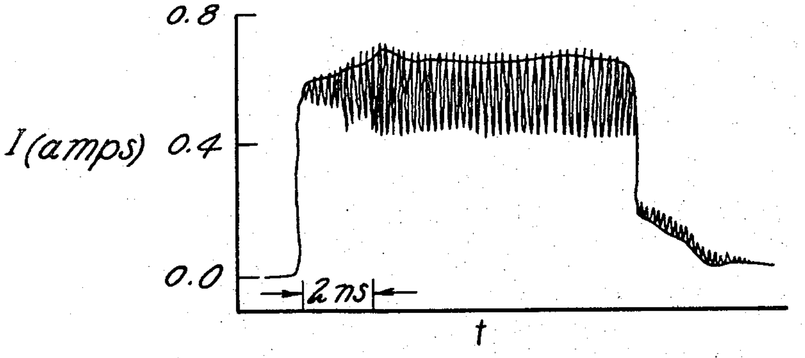
FIGURE 3 shows the current oscillations of the prior art Gunn oscillator.

Referring specifically to FIGURE 1, an n-type GaAs crystal 10 is inserted in a circuit containing resistor $R_1$, capacitor C and resistor $R_2$ in parallel. Contacts 11 and 11' are connected to crystal 10 as will be described. Crystal 10 is preferably enclosed within an enclosure illustrated at 16 and the enclosure is cooled to between 195° K. and 300° K. by temperature control 18. Crystal 10 may be a disc-shaped single crystal whose surfaces form a 111 plane. Typical specimens have room-temperature resistivities between 0.2 and 3.0 ohm-centimeters, and mobilities of about 5000. A pulse generator 12 supplies pulses between approximately $100 \times 10^{-9}$ and $25 \times 10^{-6}$ seconds to the circuit. Output terminals 14 may be connected to appropriate conditioning or amplifying circuitry.

A DC source is required which will provide sufficient voltage and current to establish electric fields within the sample of the order of several kilovolts per centimeter. The voltage source may be in the form of a pulse generator, battery or equivalent power supply. Once the critical electric field is established in the sample the oscillations will occur. The oscillations will be coherent when $R_1$ and $R_2$ are adjusted to be less than the DC resistance of the GaAs specimen. Capacitance C is the capacitance of the plates between which the crystal is held, and is but a few $\mu\mu$farads in magnitude.

Crystals which exhibit normal Gunn behavior whereby current oscillations do not exceed $I_T$ at 300° K. and above will exhibit large amplitude oscillation at 195° K.

Large amplitude oscillations are maximized for the crystals at some temperature between 195° K. and 300° K.

The large amplitude oscillations have a higher frequency spectrum than an equivalent length Gunn oscillator. In some cases large amplitude oscillations have been observed with frequencies of the order of 3 or 4 times higher than expected for an equivalent Gunn oscillator.

A method for preparing the contacts 11 and 11' is to first etch the n-type GaAs crystals to the desired thickness in a solution comprising three parts $H_2SO_4$, one part $H_2O$ and one part $H_2O_2$. The etched crystal is then rinsed in distilled water, placed in a 5% NaCN aqueous solution, and rinsed again in distilled water. Following the rinsing the crystals are dried in a desiccator for at least two hours.

Next the crystal is placed between two graphite slabs in which holes have been drilled to expose opposite faces of both sides of the crystal. The graphite slabs with the crystal therebetween are then clamped in an aluminum holder and placed between two tin evaporation sources in a vacuum bell jar. The jar is evacuated to approximately 1 or $2 \times 10^{-6}$ torr, and the graphite and crystal are heated to about 375° C. for two to three minutes. The temperature is monitored by a thermocouple buried in a small hole in the graphite. Heat is applied by passing a current of approximately 100 amperes through the aluminum and graphite holder.

While maintaining the temperature of 375°, the tin evaporators are flashed for ten seconds, thereby coating both sides of the crystal simultaneously with the tin alloying immediately.

After flashing, both the evaporator and crystal heating current are shut off and the crystal allowed to cool.

When removed from the bell jaw, the crystal, now coated with tin contacts on opposite sides of the crystal, is ultrasonically cut into small discs suitable for use. Each small disc now has the proper contacts on its opposing faces.

Presently it is speculated that the large amplitude oscillations are due to a combination of the Gunn effect and a contact phenomenon produced by the novel method for bonding the leads. Generally it is observed that threshold is first achieved for Gunn oscillations and with further increase in applied voltage the large amplitude oscillations suddenly occur. The large amplitude mode can be maximized by adjusting the sample temperature in the range between 195° K. and 300° K. This effect is reproducible and is found to occur in samples which are prepared in the above-prescribed manner.

The alloying of the tin to the GaAs forms an $n\text{-}n^+$ contact. The alloying temperature and time controls the gradation of the contact. The temperature dependence of the large amplitude oscillations strongly suggests that what is occurring is that there is further control over the characteristics of the $n\text{-}n^+$ region. A speculation for the source of the large amplitude oscillations is that a conductivity modulation is obtained by means of a controlled avalanche breakdown in the contact region.

It is believed that all n-type semiconductor materials which have a similar multivalley band structure as GaAs and which exhibit the Gunn oscillations can be fabricated to oscillate in the large amplitude mode by preparing the contacts as described above.

The power output of the device is determined by the sample resistivity, carrier mobility, and sample contact area, and the upper limit on power is determined by proper heat dissipation from the sample.

A typical sample having the dimensions of 0.01 cm. thickness and .075 cm. diameter and a low voltage resistance of 50Ω at 195° K. and an electron mobility of 5000 v. sec./cm.$^2$ requires a voltage in excess of 25 v. for oscillation. This results in a current flow of approximately 0.5 ampere through the sample.

Although the preferred method encompassed by the invention has been described herein, it will be apparent to those skilled in the art that changes in the method and operation of this invention can be made without departing from the scope of the invention as hereinafter claimed.

I claim:

1. The method of bonding tin contacts to a gallium arsenide semiconductor crystal comprising the steps of forming the crystal to the desired thickness, rinsing and drying the crystal, clamping the crystal between two slabs having holes therein to expose said crystal, placing said clamped crystal between two tin evaporation sources in a vacuum chamber, evacuating said chamber, heating said crystal to about 375° C. for two to three minutes, and flashing said evaporators.

2. The method of bonding contacts as in claim 1 in which said slabs are graphite.

3. The method of bonding contacts as in claim 2 and including the step of heating the crystal by passing a current through the graphite slabs.

4. The method of bonding contacts as in claim 2 and including the step of monitoring the crystal temperature by positioning a thermocouple in the hole in the graphite slab.

5. The method of bonding contacts as in claim 4 in which the vacuum chamber is evacuated to about $2 \times 10^{-6}$ torr.

6. The method of bonding contacts as in claim 5 and including the step of etching the crystal in a solution of $H_2SO_4$, $H_2O$ and $H_2O_2$ to obtain a crystal of desired thickness.

References Cited

UNITED STATES PATENTS 3,028,262 4/1962 Klingsporn ------ 117—107 XR
3,087,838 4/1963 Lubin -------------- 117—213

OTHER REFERENCES

German Anslegeschrift 1,141,726, December 1962.

WILLIAM L. JARVIS, *Primary Examiner.*